United States Patent
Mansoorian

(10) Patent No.: US 6,452,528 B1
(45) Date of Patent: Sep. 17, 2002

(54) DOUBLE COMPARISON SUCCESSIVE APPROXIMATION METHOD AND APPARATUS

(75) Inventor: Barmak Mansoorian, Pasadena, CA (US)

(73) Assignee: Photobit Corporation, Pasadena, CA (US)

(*) Notice: Subject to any disclaimer, the term of this patent is extended or adjusted under 35 U.S.C. 154(b) by 0 days.

(21) Appl. No.: 09/360,294

(22) Filed: Jul. 22, 1999

Related U.S. Application Data

(60) Provisional application No. 60/093,834, filed on Jul. 22, 1998.

(51) Int. Cl.$^7$ ............................................. H03M 1/12
(52) U.S. Cl. .................... 341/155; 341/156; 341/162; 341/163
(58) Field of Search ............................. 341/118, 156, 341/159, 162, 163, 155

(56) References Cited

U.S. PATENT DOCUMENTS

| | | | | |
|---|---|---|---|---|
| 3,153,142 A | * | 10/1964 | Hellerman | 341/165 |
| 3,729,732 A | * | 4/1973 | Yano | 341/118 |
| 4,454,500 A | * | 6/1984 | Kato et al. | 341/108 |
| 4,584,558 A | * | 4/1986 | Maschek et al. | 341/139 |
| 4,641,129 A | * | 2/1987 | Doluca et al. | 341/156 |
| 4,649,371 A | * | 3/1987 | Kolluri | 341/159 |
| 5,057,841 A | * | 10/1991 | Veerhoek et al. | 341/156 |
| 5,417,215 A | | 5/1995 | Evans et al. | 128/660.06 |
| 5,459,465 A | * | 10/1995 | Kagey | 341/156 |
| 5,534,864 A | * | 7/1996 | Ono et al. | 341/156 |
| 6,075,478 A | * | 6/2000 | Abe | 341/155 |
| 6,163,291 A | * | 12/2000 | Uchino et al. | 341/163 |

* cited by examiner

Primary Examiner—Michael Tokar
Assistant Examiner—Steven S. Paik
(74) Attorney, Agent, or Firm—Fish & Richardson P.C.

(57) ABSTRACT

A double comparison successive approximation A/D converter. The converter compares the value with upper and lower limits. The bit values are not set unless the value is distant from the compared value. Otherwise, the value of the bit is held until later when the bit does fall outside the limits.

6 Claims, 2 Drawing Sheets

DOUBLE COMPARISON SUCCESSIVE APPROXIMATION METHOD AND APPARATUS

CROSS REFERENCE TO RELATED APPLICATIONS

This application claims the benefit of U.S. Provisional application Ser. No. 60/093,834, filed on Jul. 22, 1998.

FIELD

The present invention describes a new technique of successive approximation.

BACKGROUND

The successive approximation algorithm is well known. One application for the success of approximation algorithm is in a column parallel A to D converter of the type described in U.S. Pat. No. 5,471,515. Each value from each column needs to be A to D converted. A successive approximation converter has been found to represent a good tradeoff between quality, speed, and size on the die.

One problem with the successive approximation system, however, is settling time of the capacitors that are used. This limits the speed of such a device.

SUMMARY

The present disclosure describes a new successive approximation technique called the Error-Correcting Successive Approximation Technique. This technique uses multiple comparisons per clock cycle, e.g. two comparisons per clock cycle. While double the number of comparisons are needed, the way in which the comparisons are carried out obviates the need for accurate settling and comparison at each clock cycle. two comparisons are used at each clock cycle, each of which requires less resolution. While twice as many cycles are needed, the overall conversion time can still be significantly reduced.

BRIEF DESCRIPTION OF THE DRAWINGS

These and other aspects of the invention will now be described with reference to the attached drawings, in which.

DESCRIPTION OF THE PREFERRED EMBODIMENTS

Figure 1:
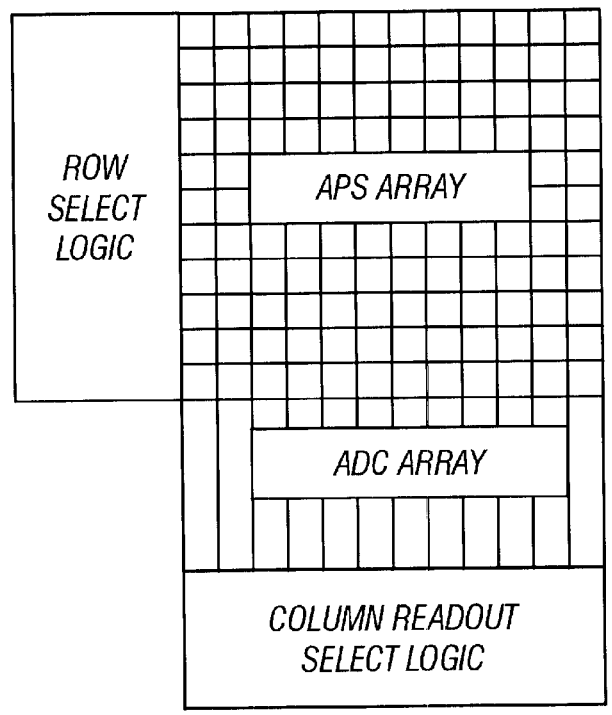
FIG. 1 shows an active pixel sensor with column parallel architecture.

FIG. 1 shows a block diagram of a column-parallel active pixel sensor array with its row select logic 100 controlling the active pixel sensor array 102 to output a row at a time. More generally, this system could output any unit of pixels, e.g., one row or column, more than one row or column, or less than one row or column, at each time. The disclosed embodiment from here on describes column-parallel. The entire row is output into a column parallel array of A to D converters which are controlled by column readout select logic.

Since an entire row is read out at one time, the entire row can be converted in parallel. This reduces the need for speed: as compared with the speed of the A to D converter which would be necessary if one pixel was read out at each time.

For example, the minimum conversion speed of an A to D converter in each column of a 2048×2048 image sensor at a 200 hertz frame rate is approximately 400 kilohertz. Other items on the chip may require slightly faster operation from the A to D converter, but different techniques such as pipelining and off-shift transfer can minimize this value.

Conventional successive approximation is typically carried out by holding the signal bus constant and successively charging up a reference bus, until the reference bus is sufficiently close to the signal bus. The reference bus is charged by a binary weighted voltage. Each clock cycle incrementally changes the next bit of the binary weighting. A comparison is then made to determine if the following bit needs to be raised or lowered. The voltage charges back to its previous level every time the voltage exceeds the signal level.

Mathematically, the successive approximation technique is expressed as:

Vin>DAC, DAC=DAC+weight
Vin<DAC, DAC=DAC−weight

Each bit of resolution requires an extra conversion. For a 10-bit converter, for example, the conversion is made 10 times. The value of the binary weighting in the digital to analog converter therefore represents the output of the A to D converter.

While this approach is extremely powerful, its ultimate resolution is limited by matching between capacitance values. Resolutions in the 8 to 10 bit range require relatively large capacitance values. The conversion speed of the ADC then becomes limited by the settling time; which is the time it takes the DAC values to settle to the required resolution.

The disclosed technique compares each value, at each time, to a range around the previous value, e.g., PV+weight/2 and PV−weight/2. A one-bit value advance is only made when the previous value is outside this range. Hence, the bit is only advanced when the error between the signal to be converted, and the current estimate, is high. In this way, the amount of capacitor settling is minimal.

When the input value is between the previous value plus and minus weight/2, the current clock cycle is called "too close to call" and labeled with an "X". The system then goes on to test the next clock cycle.

The above-described technique is described as follows.

Vin>DAC+weight/2;DAC=DAC+weight
Vin<DAC−weight/2;DAC=DAC−weight
else wait

Note that two comparisions are required for each tested bit. However, the A to D converter changes the DAC code only if the absolute value of the result is larger than half the weight. Otherwise, the DAC value does not change as the weight is moved to the next value. The don't-care values are changed later in the conversion.

This system responds only to large differences. As such, it requires much less capacitor settling.

Figure 2:
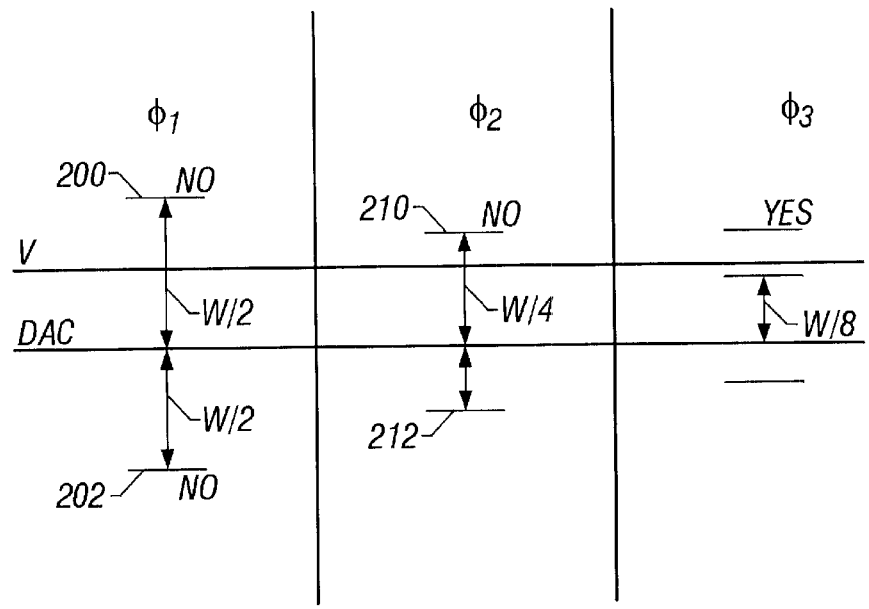
FIG. 2 shows a timing diagram of the new conversion scheme.

The operation progresses as shown in FIG. 2. Assume an analog value V as shown in FIG. 2 and three cycles. During the first cycle, the weight is a first value W1, and the DAC value is shown as the value DAC. The input voltage V is not greater than DAC+W/2 (level 200) or less than DAC−W/2 (level 202). Hence, the bit is not changed and a don't care is established.

In the next clock cycle, shown as Clock Cycle $\phi_2$, the values are compared with DAC plus $W/2^2=W/4$ (level 210) and DAC minus W/4 (level 212): the next weight in the progression. Again, the value V is not outside either of these limits, so the DAC value is again not changed.

In Clock cycle $\phi_3$ the limits are DAC+W/8 and DAC−W/8. The value is within this range, but still less. Hence, this tells us in retrospect that the two bits for $\phi$1 and $\phi$2 need to be zeroes, and that the bit for $\phi$1 needs to be a one. This sets a new DAC value using these new bits which have been found—including the bits previously marked as "X". However, these two X bits for these previous clock cycles are not found until later in the conversion. Moreover, these bits are found faster—that is with less capacitive settling.

Figure 3:
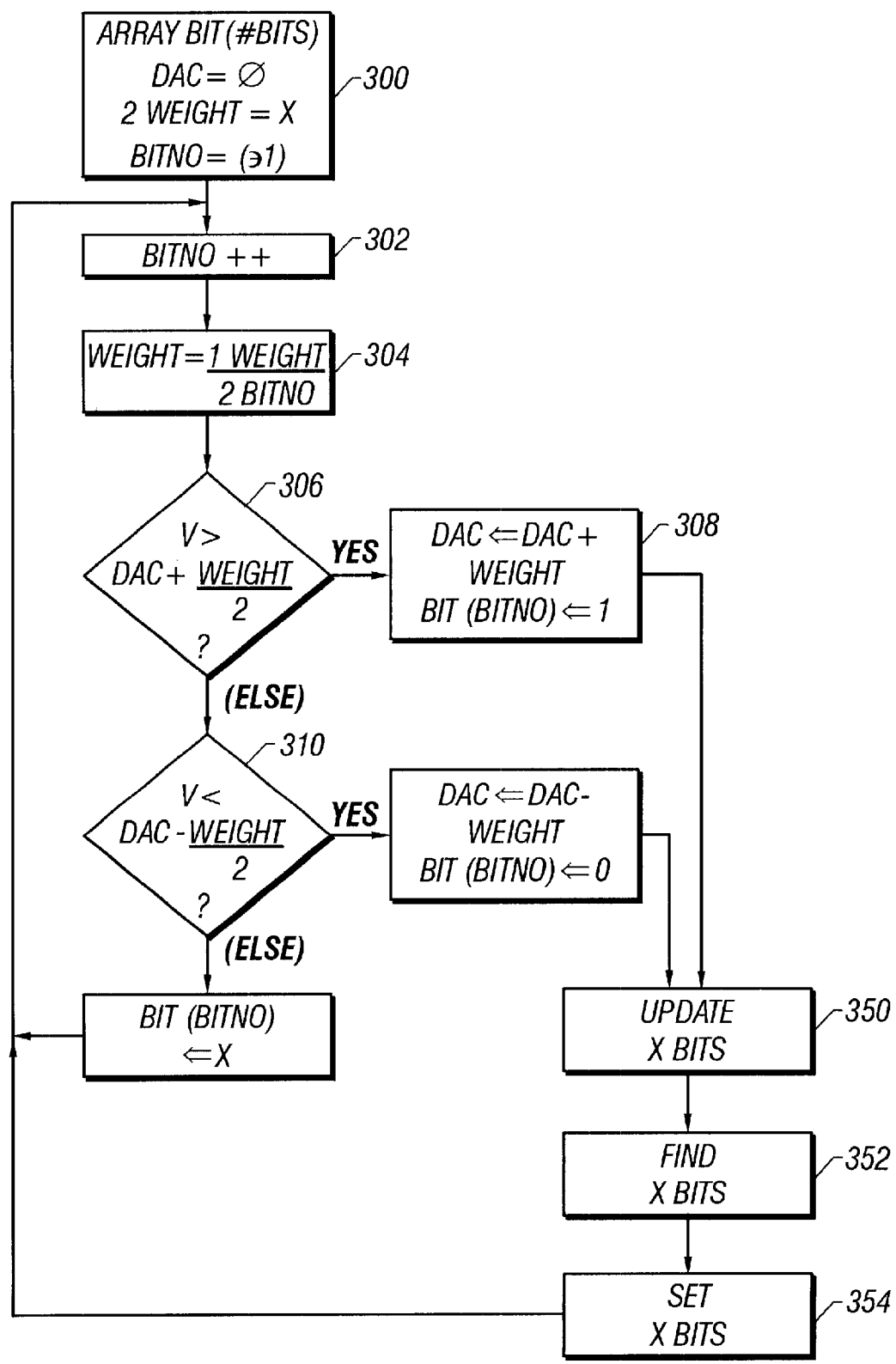
FIG. 3 shows a flowchart of operation of the new conversion scheme.

A flow chart of this operation is shown in FIG. 3. Step 300 represents an initial step of setting initial values. The initial weight is set to X, but more generally the initial weight and the initial DAC value are set based on desired characteristics of the converter.

At Step 302, the system starts by incrementing the bit number, shown as the variable BITNO. At that time, the current weight is set to the initial weight (e.g. the full-scale value) divided by 2 raised to the power of the BITNO variable. This sets the new weight at step 304.

Step 306 begins the main loop by executing the equations previously discussed. The input value V is first compared with the DAC value plus the weight/2 at Step 306. If higher, and only if higher, the current bit value, BIT(BITNO) is set to a "1" at Step 308. The DAC output value is also increased by the weight. Control then passes to the "update X bits" routine 350, discussed herein, and then proceeds to the main loop.

Step 310, executed only if the voltage is not greater than DAC plus weight/$2^n$, compares the voltage with DAC minus weight/$2^n$. If the voltage is less, then step 312 executes a corresponding routine to the one executed at 308, setting the bit number to 0, and correspondingly reducing the output value of the DAC. Again, the X bits are updated at 350, if necessary.

If V is between DAC±weight/$2^n$, the bit is set to "X" or don't care at 312. The update routine is shown beginning at step 350. This first finds the "X" bits, that is the bits which have been set at step 312 temporarily to the "don't-care" state. Step 354 then determines if the last bit set was a zero or a one. This corresponds to a determination that the final value was higher or lower. The X values are set at step 354. This can use, for example, a look up table to determine the proper bits for the circumstance. Control then again passes to step 302 to continue the processing of bits.

Although only a few embodiments have been described in detail above, other embodiments are contemplated by the inventor and are intended to be encompassed within the following claims. In addition, other modifications are contemplated and are also intended to be covered.

What is claimed is:

1. A method of conversion between analog and digital, comprising:

obtaining a value to be converted;

comparing said value with an upper limit and a lower limit which are spaced from one another;

establishing a value of a bit responsive to said comparing, only if the value to be converted is greater than the upper limit or lower than the lower limit; and otherwise, not establishing a value of said bit responsive to said comparing until a later time.

2. A method as in claim 1, further comprising waiting until said later time, and setting values for the bits that were not established at said later time.

3. A method as in claim 2, wherein said later time is a time when a value of a current bit is between the upper limit and the lower limit.

4. A method as in claim 3, wherein the bits are set based on a value of a look up table.

5. A method as in claim 1, wherein, during an nth cycle, comparing an input voltage to a current digital value DAC plus a current weight divided by $2^n$, where n is the value of the digital cycle, and DAC plus the weight over $2^n$.

6. A double comparison successive approximation D/A converter, comprising:

a buffer, storing a current value of digital bits; and a comparator, comparing a value to be converted to a value indicated by said digital bits plus an offset, and to a value indicated by said digital bits minus the offset, and establishing a new digital bit at a current time only if the current value is outside said limits otherwise establishing the current digital bit at a later time.

* * * * *